United States Patent [19]

Perkins

[11] Patent Number: 5,446,375
[45] Date of Patent: Aug. 29, 1995

[54] RELUCTANCE SENSOR HAVING VARIABLE THRESHOLD DETECTION CIRCUIT

[75] Inventor: Luke Perkins, Security, Colo.

[73] Assignees: AT&T Global Information Solutions Company, Dayton, Ohio; Hyundai Electronics America, Milpitas, Calif.

[21] Appl. No.: 961,974

[22] Filed: Oct. 16, 1992

[51] Int. Cl.⁶ .................. G01P 3/46; G01P 3/488; F02P 17/02; H03K 5/24
[52] U.S. Cl. .................. 324/163; 123/146.5 A; 324/173; 324/207.25; 327/72; 327/94; 327/337; 327/516; 364/565
[58] Field of Search .............. 324/160, 163, 166, 173, 324/174, 207.15, 207.16, 207.25; 123/146.5 A, 617; 188/181 R; 364/565; 307/352, 354, 358, 359, 510, 515, 516; 327/72, 73, 94–96, 337, 516

[56] References Cited

U.S. PATENT DOCUMENTS

| | | | |
|---|---|---|---|
| 3,094,665 | 6/1963 | Wildman | 307/358 X |
| 4,121,112 | 10/1978 | Hartig | 324/173 X |
| 4,175,256 | 11/1979 | Dolikian | 307/358 X |
| 4,258,324 | 3/1981 | Henrich | 324/173 X |
| 4,293,814 | 10/1981 | Boyer | 324/173 X |
| 4,367,721 | 1/1983 | Boyer | 123/617 |
| 4,575,677 | 3/1986 | Dennis | 324/166 X |
| 4,609,990 | 9/1986 | Sember et al. | 324/166 X |
| 4,635,142 | 1/1987 | Haugland | 307/358 X |
| 4,836,616 | 6/1989 | Roper et al. | 188/181 R X |
| 4,914,387 | 4/1990 | Santos | 324/166 |
| 5,012,207 | 4/1991 | Edwards | 324/173 X |
| 5,015,879 | 5/1991 | Lasagna et al. | 307/358 |
| 5,029,286 | 7/1991 | Kirschner | 324/173 |
| 5,144,233 | 9/1992 | Christenson et al. | 324/173 X |
| 5,221,250 | 6/1993 | Cheng | 324/166 X |

Primary Examiner—Gerard R. Strecker
Attorney, Agent, or Firm—Wayne P. Bailey; Gregory Welte; Douglas Foote

[57] ABSTRACT

A reluctance sensor produces reluctance signals in response to passing slots in a rotating wheel. When a given signal exceeds a threshold, a DIG_OUT signal is produced. When the signal falls to zero, the DIG_OUT signal is terminated. The invention adjusts the threshold, based on the magnitude of the reluctance signals. Since the magnitude of the reluctance signals depends on wheel speed, the invention, in effect, adjusts the threshold based on wheel speed, yet without independently measuring wheel speed.

5 Claims, 11 Drawing Sheets

600 RPM

1800 RPM

6000 RPM

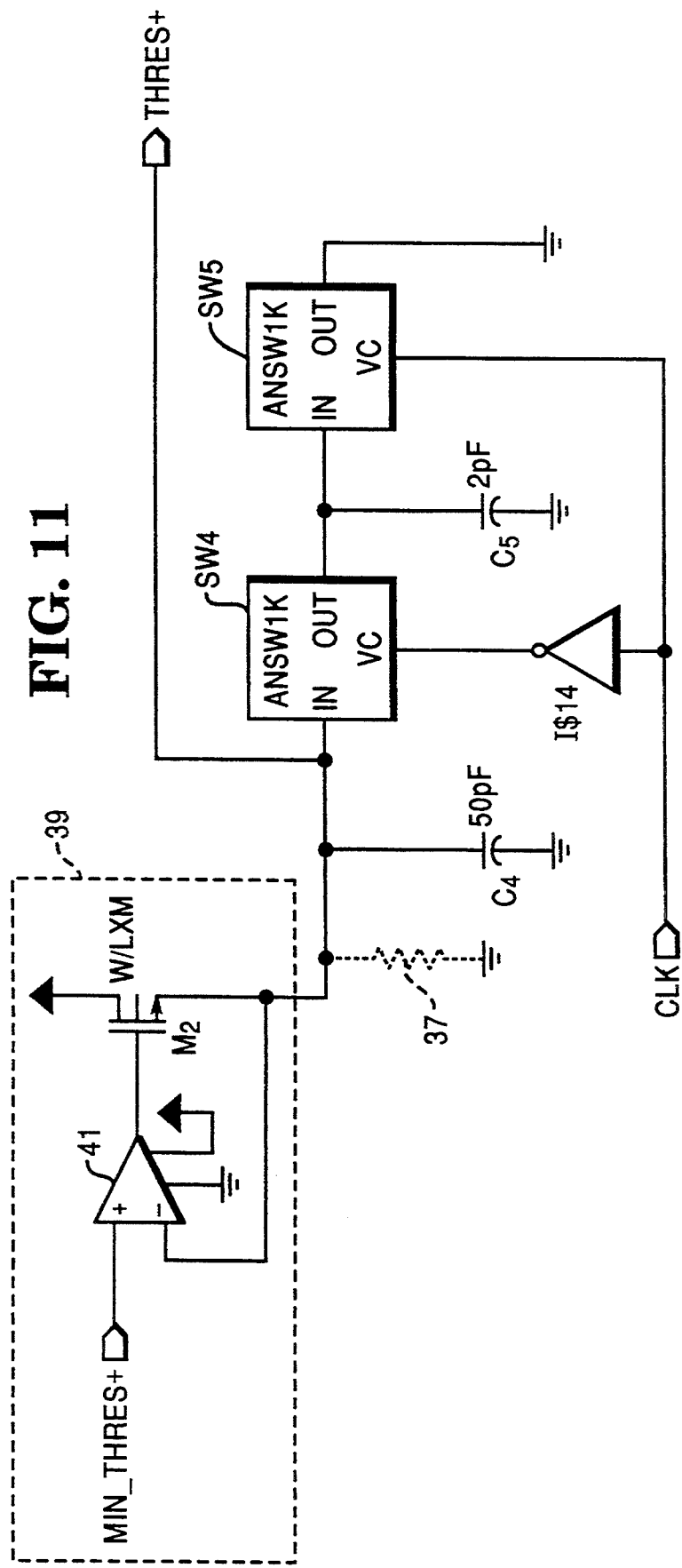
FIG. 11
FIG. 11A
FIG. 11B

RELUCTANCE SENSOR HAVING VARIABLE THRESHOLD DETECTION CIRCUIT

The invention relates to apparatus for processing the signals produced by reluctance sensors. In particular, such sensors can be used to detect rotational speed of a wheel. As speed increases, electrical noise associated with the signal also increases. At some speed, the noise becomes greater than the signal itself was at a lower speed. This fact makes it difficult to detect the signal at both high and low speeds.

BACKGROUND OF THE INVENTION

Overview

An analogy can explain a problem which the invention solves. If car radio is playing softly, a person can hear it while driving slowly. However, as speed increases, the radio volume must be turned up, because the background noise of wind, trucks, etc., will drown the radio's sound.

Similarly, a reluctance sensor 3 (analogous to the radio) in FIG. 2 produces an electrical signal when a slot 6 in wheel 9 passes it. (The passing slot causes the signal because the wheel and the sensor are inductively coupled together, like a transmitting and a receiving antenna. The passing slot disrupts the coupling, or mutual inductance, and produces the signal.)

At low speeds, the reluctance signal is small, as indicated in FIG. 4A. (The signal depends on the rate of change of inductance, dL/dt. For a slowly passing slot, dL/dt is small.) At low speeds, background noise is also small. (Background noise is caused by factors such as vibration. Vibration rocks the sensor back and forth from the wheel, and introduces its own change in coupling. At low speeds, the rocking is small.)

At higher speeds, the reluctance signal is higher, as in FIG. 4C (because the slot passes by the sensor faster), and background noise is also higher (because the rocking is greater).

This higher background noise at high speed is the problem: If a detector is sensitive enough to respond to small reluctance signals at low speeds, then, at high speeds, the detector will respond to both the background noise as well as the reluctance signals.

That is, the detector cannot "hear" the reluctance signal behind the background noise, just as the radio listener cannot hear the soft radio behind the wind noise.

Background in Detail

Magnetic reluctance, is somewhat analogous to electrical resistance. That is, in the case of resistance, the equation V=IR is applicable, wherein V is voltage, I is current, and R is the resistance. For a fixed voltage, as resistance increases, current through the resistance decreases.

Magnetic reluctance has a similar equation, namely, $V_m = \Phi \Re$, wherein $V_m$, is magnetomotive force (or "magnetic field"), $\Phi$ is total magnetic flux (ie, $\Phi$ is the total number of "flux lines"), and $\Re$ is magnetic reluctance. (Reluctance is the reciprocal of magnetic permeability, $\mu$.) For a fixed magnetomotive force, as reluctance increases, flux decreases.

Metals, in general, have a high magnetic permeability, and thus a low reluctance, as compared with air. Thus, for example, if a block of metal is placed within a magnetic field, as in FIG. 1, the flux lines will preferentially pack into the metal as compared with air. Restated, it is "easier" for the magnetic field to create a large number of flux lines within the metal than within the air.

This fact is used in reluctance sensors. (The sensor generates flux lines within nearby materials. Associated electronics measure changes in the number of flux lines generated.) FIG. 2 illustrates one such sensor 3 located near a slotted wheel 9. As each slot 6 passes the sensor, the reluctance changes. That is, in FIG. 3A, reluctance is 10w, because the sensor "sees" mostly metal (more flux lines can be packed into the metal). In FIG. 3B, reluctance is higher, because the sensor sees the slot, which is mostly air, which has a higher reluctance (fewer field lines can be packed in). Then, in FIG. 3C, reluctance is low again, because of the greater amount of metal near the sensor.

When the sensor is driven by electronic equipment known in the art, a signal resembling that shown in FIG. 4A can be derived from the changing reluctance of the rotating slotted wheel. The signal has a zero crossing 12, (shown in FIG. 4B) which occurs when the center 13 (or other reference point) in FIG. 2 of the slot passes the probe coil. Such a sensor is commonly called a "reluctance sensor."

(It should be noted that the term "reluctance sensor" is somewhat inaccurate: the signal of FIG. 4A does not directly indicate reluctance. That is, when the zero crossing occurs, reluctance does not actually go to zero; some finite reluctance still exists. Rather, the signal represents a time-derivative of a voltage derived from reluctance. The time-derivative does go to zero, when the reluctance reaches its minimum.)

Therefore, the change in reluctance seen by the sensor can be used to measure speed and angular position of the slotted wheel. However, in practice, numerous factors introduce electrical noise, which tends to obscure the signal. For example, the slotted wheel can be connected to a crankshaft in an automotive engine. The engine vibrates. The vibration increases, in both frequency and amplitude, as engine speed increases.

The vibration induces the probe coil to also vibrate, meaning that the probe coil moves with respect to the slotted wheel: distance D in FIG. 2 periodically changes. This change in D changes the signal of FIG. 4A, because the change in D causes its own change in reluctance.

When D is larger, more air is present near the probe coil, thus increasing reluctance; when D is smaller, less air and more metal is present, decreasing reluctance. The vibration gives false readings of reluctance; the vibration introduces noise spikes, as indicated in FIGS. 4A and 4C.

The noise causes the following problem. At low speeds, the signal produced by the probe coil is small, as indicated in FIG. 4A. At low speeds the noise signals are also small. At high speeds, as in FIG. 4C, both the noise and the probe-coil-signal are large. The problem is designing an apparatus which will detect the reluctance signal at both high and low speeds.

If a comparator is used having a fixed threshold, the threshold must be above or below the noise level. If the threshold is below the noise level, then, at high engine speeds, the noise itself triggers the comparator. On the other hand, if the threshold is above the noise level, then, at low engine speeds, the comparator will not detect the probe coil signals: they are too small.

It may be thought that the threshold can be adjusted, based on engine speed. In principle, this solution is possible, but requires a separate measuring apparatus for measuring engine speed, which is expensive.

OBJECTS OF THE INVENTION

It is an object of the invention to provide an improved sensor for rotational position of a shaft.

SUMMARY OF THE INVENTION

In one form of the invention, a reluctance sensor produces reluctance signals in response to passing slots in a rotating wheel. When a given signal exceeds a threshold, a DIG_OUT signal is produced. When the signal falls to zero, the DIG_OUT signal is terminated. The invention adjusts the threshold, based on the magnitude of the reluctance signals. Since the magnitude of the reluctance signals depends on wheel speed, the invention, in effect, adjusts the threshold based on wheel speed, yet without independently measuring wheel speed.

BRIEF DESCRIPTION OF THE DRAWINGS

FIGS. 11, 11A and 11B illustrate the LEAKY INTEGRATOR of FIG. 5.

DETAILED DESCRIPTION OF THE INVENTION

Overview

Figure 5:
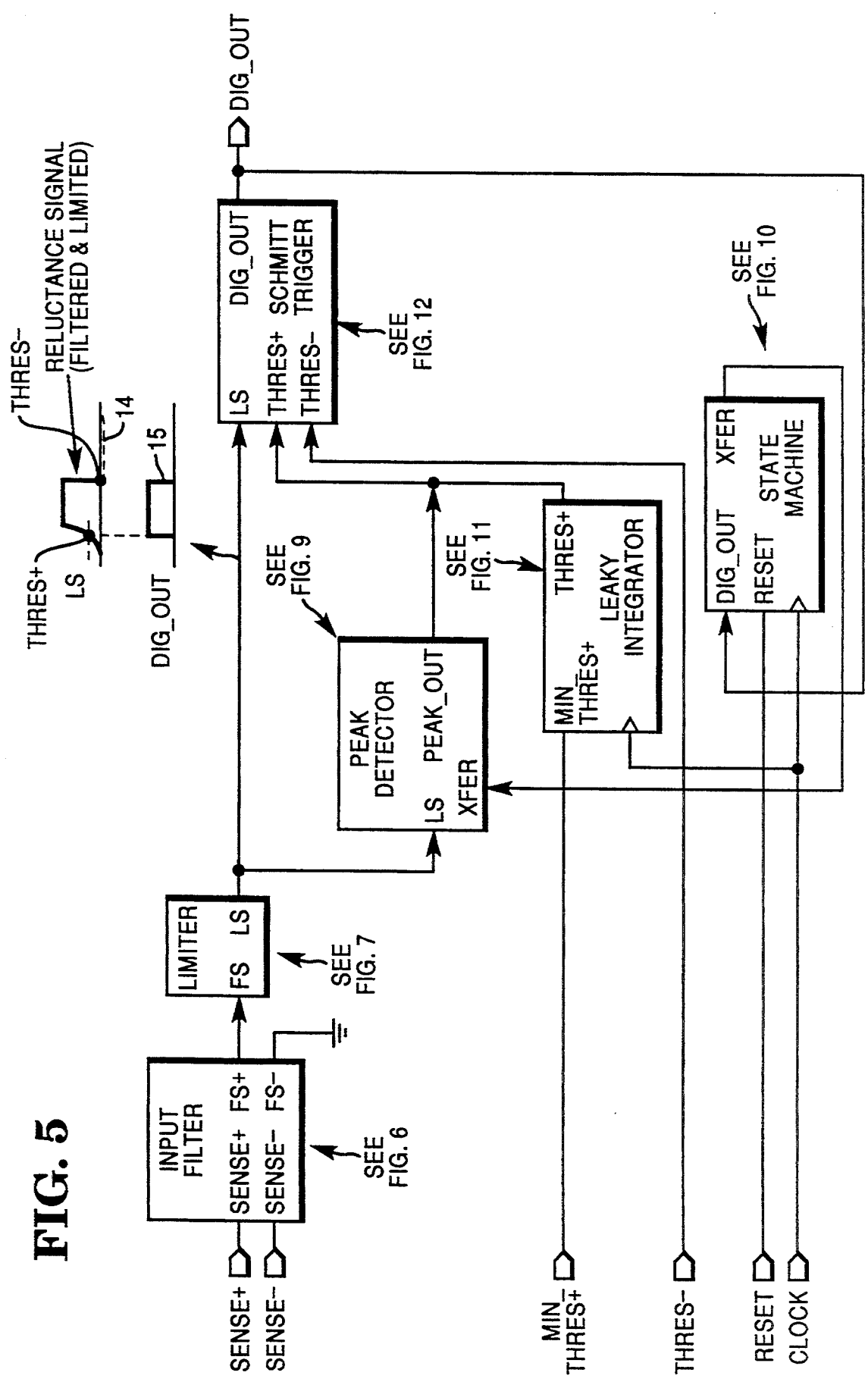
FIG. 5 is an overview of one form of the invention.

FIG. 5 gives an overview of the invention. A SCHMITT TRIGGER is triggered by a signal, LS, which is derived from the reluctance signal. The triggering occurs when the signal LS exceeds THRES+, as indicated at the upper right part of the Figure.

THRES+ is not fixed in value, but increases as engine speed increases. At low speeds, THRES+ is small enough that the small reluctance signals will trip the SCHMITT TRIGGER. At high speeds, THRES+ is large enough that the noise signals do not trip the SCHMITT TRIGGER. The adjustment of THRES+ is handled by the combined operation of the blocks labeled PEAK DETECTOR, LEAKY INTEGRATOR, and STATEMACHINE. In brief, the PEAK DETECTOR samples and holds the LS signal, which is large at high speeds and small at low speeds. The STATE MACHINE updates THRES+ with the sampled-and-held value at each falling edge of DIG_OUT.

Figure 1:
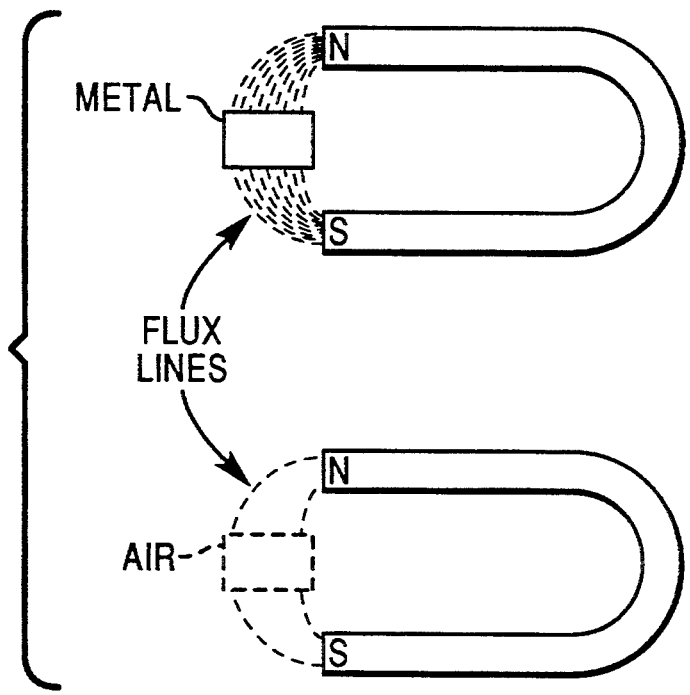
FIG. 1 illustrates how a magnetic field generates more flux lines within a metal than within air.
Figure 2:
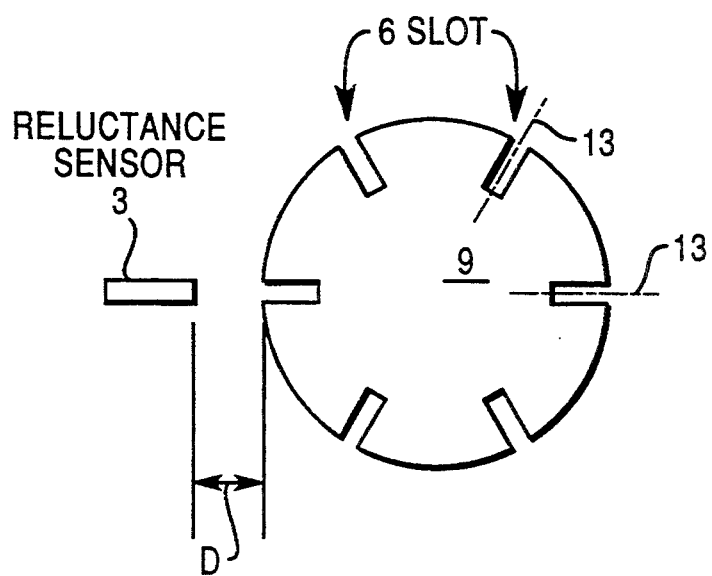
FIG. 2 illustrates a reluctance sensor and a slotted wheel.
Figure 3A:
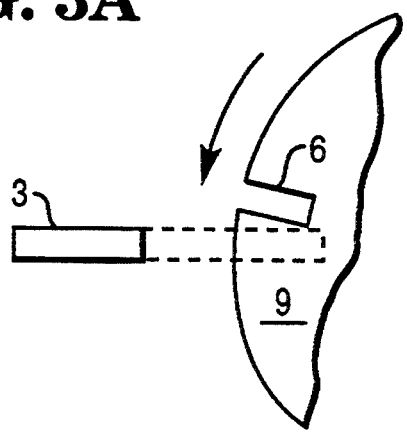
FIGS. 3A-3C illustrate a slot passing the reluctance sensor of FIG. 2.
Figure 3B:
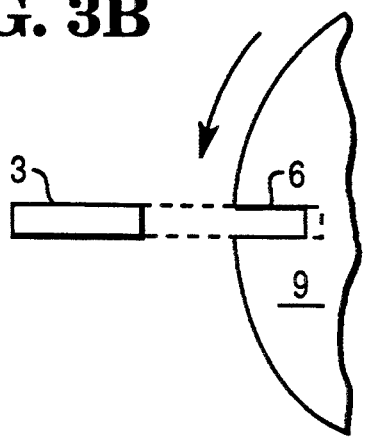
Figure 3C:
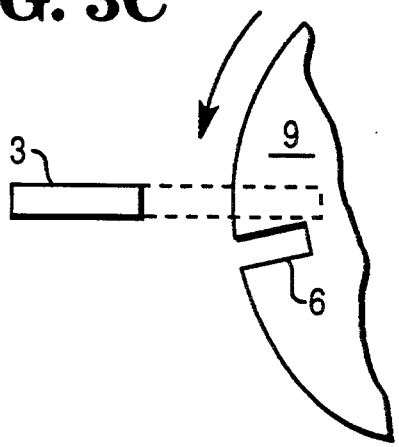

The SCHMITT TRIGGER is reset when the reluctance signal falls to THRES−, as indicated: DIG_OUT falls to zero at this time. THRES− is fixed, preferably at 0.0 volts. When DIG_OUT falls to zero, the center 13 in FIG. 2 of the slot responsible for the triggering is exactly aligned with the sensor 3. Thus, the falling edge 15 of DIG_OUT in FIG. 5 indicates the angular position of the slotted wheel 9 in FIG. 2.

The incoming reluctance signal is filtered and clamped by blocks INPUT FILTER and LIMITER, respectively, as will be later explained.

In an automotive environment, for an engine having six cylinders, a wheel having six slots can be used, and the DIG_OUT signal can be used to fire the spark plugs. Because THRES+ changes with engine speed, the reluctance signal at both low and high speeds can be detected, thus allowing DIG_OUT to control firing of the plugs at both high and low speeds, without independent measurement of speed of the wheel 9.

The individual components of Figure will now be considered in greater detail.

INPUT FILTER

Figure 6:
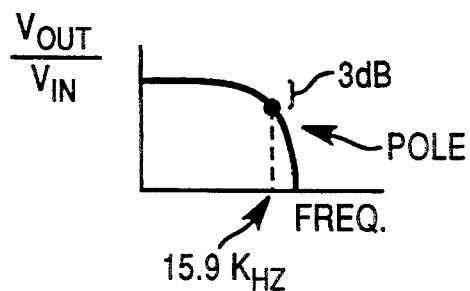
FIG. 6 illustrates in detail the INPUT FILTER of FIG. 5.
Figure 6:
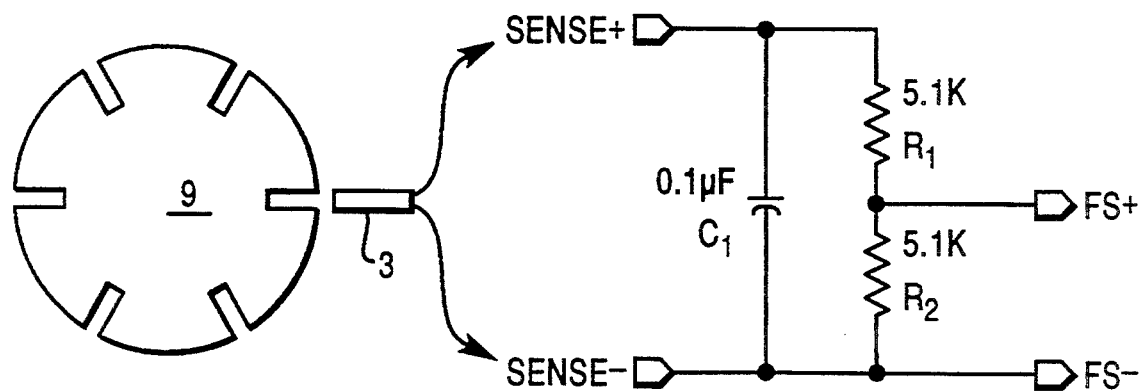

FIG. 6 shows the INPUT FILTER. Resistors R1 and R2 form a voltage divider, which divide the voltage applied to lines SENSE+ and SENSE− in half. The particular values of C1, R1, and R2, form a low-pass filter having a single pole at 15.9 kHz, as indicated in the Figure. The low-pass filter suppresses high-frequency noise.

The INPUT FILTER is implemented using discrete components, primarily because of the relatively large size of C1, namely, 0.1 μFarad. The remaining components in FIG. 5 are implemented on a single integrated circuit.

LIMITER

Figure 7:
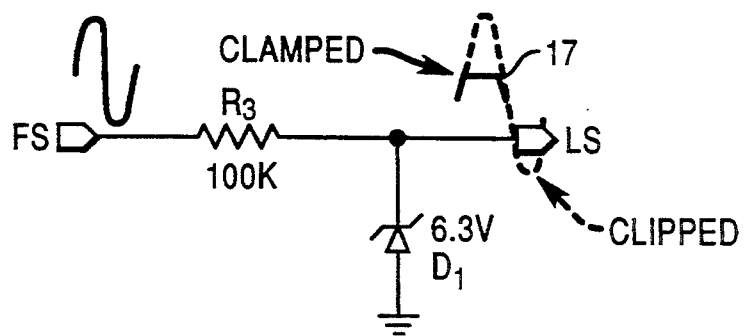
FIG. 7 illustrates the LIMITER of FIG. 5.

FIG. 7 shows the LIMITER of FIG. 5. An exemplary reluctance signal is shown at node FS. Zener diode D1 clamps the reluctance signal to 6.3 volts, as indicated by waveform 17, and prevents high voltages produced by the reluctance sensor from reaching the downstream components, which node LS feeds. Further, D1 clips the negative part (shown in phantom) of the reluctance signal at a few tenths of a volt. Thus, D1 provides both clamping (of the positive half-cycles) and half-wave rectification (by blocking, or clipping, the negative half-cycles).

Figure 4A:
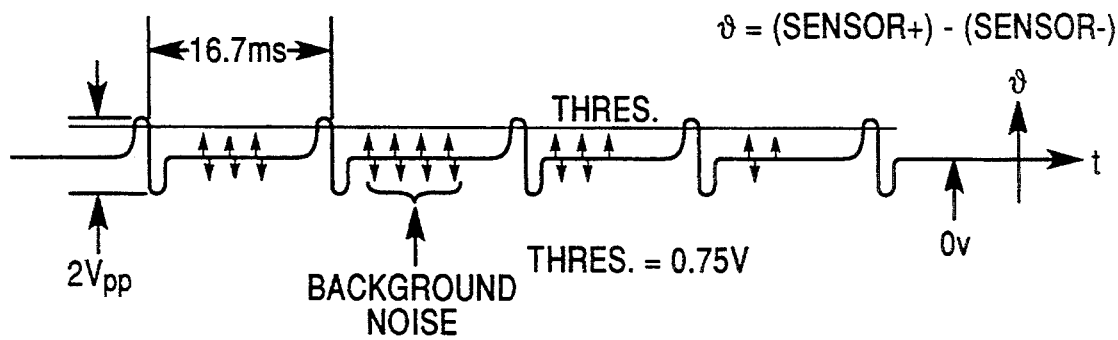
FIGS. 4A-4C illustrate three types of reluctance signals, produced at three different speeds.
Figure 4B:
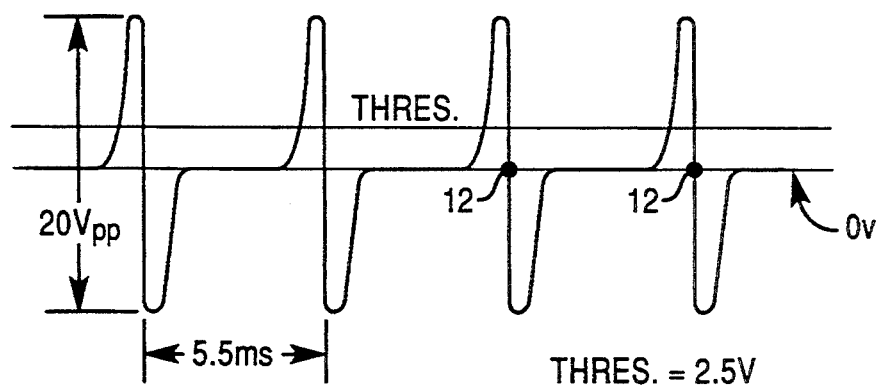
Figure 4C:
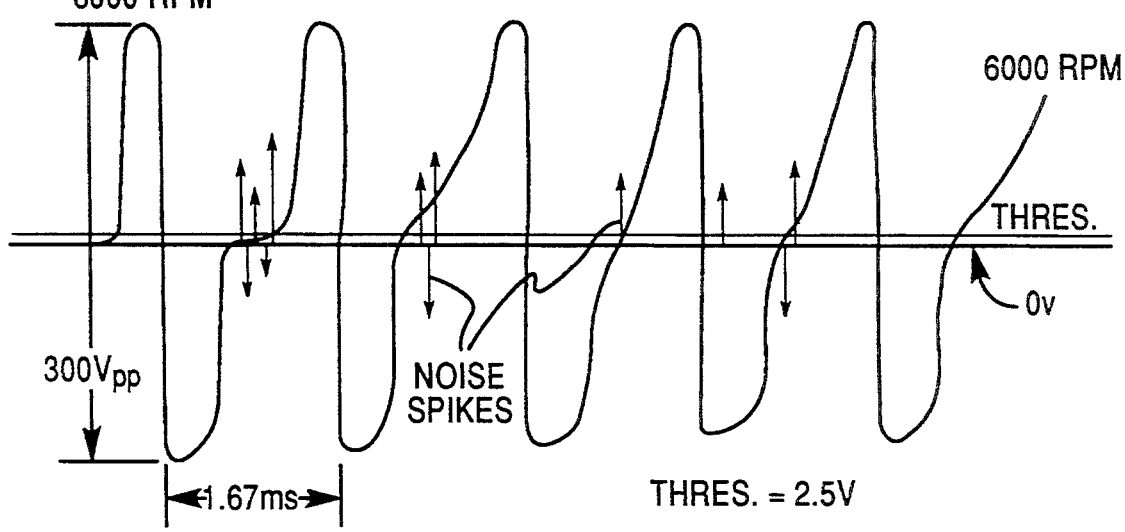

Resistor R3 is large, at 100 k-ohm. This resistor limits current passing from FS to LS, and prevents damage to both D1 and other components downstream of D1. Without R3, voltage V1 in FIG. 4C (which frequently exceeds 125 volts, zero-to-peak) would be applied directly to D1 FIG. 7, and would probably induce a current large enough to destroy D1. Resistor R3 limits this otherwise damaging current to a few milliamps (e.g., 125 volts/100,000 ohms=1.25 milliamps).

PEAK DETECTOR AND ASSOCIATED COMPONENTS

Overview

Figure 8A:
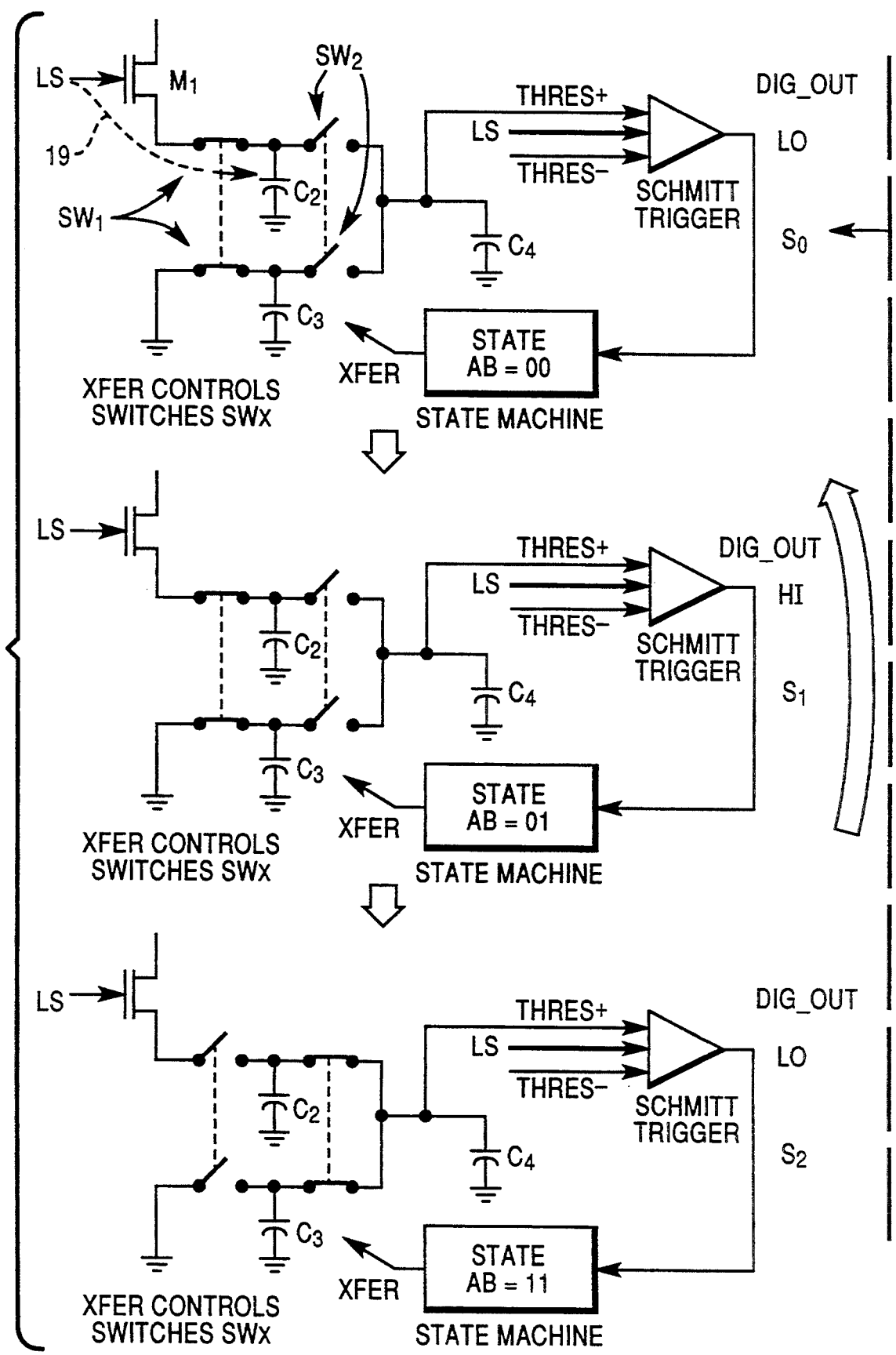
FIGS. 8A and 8B illustrates how the threshold THRES+ of the SCHMITT TRIGGER in FIG. 5 is repeatedly updated.
Figure 8B:
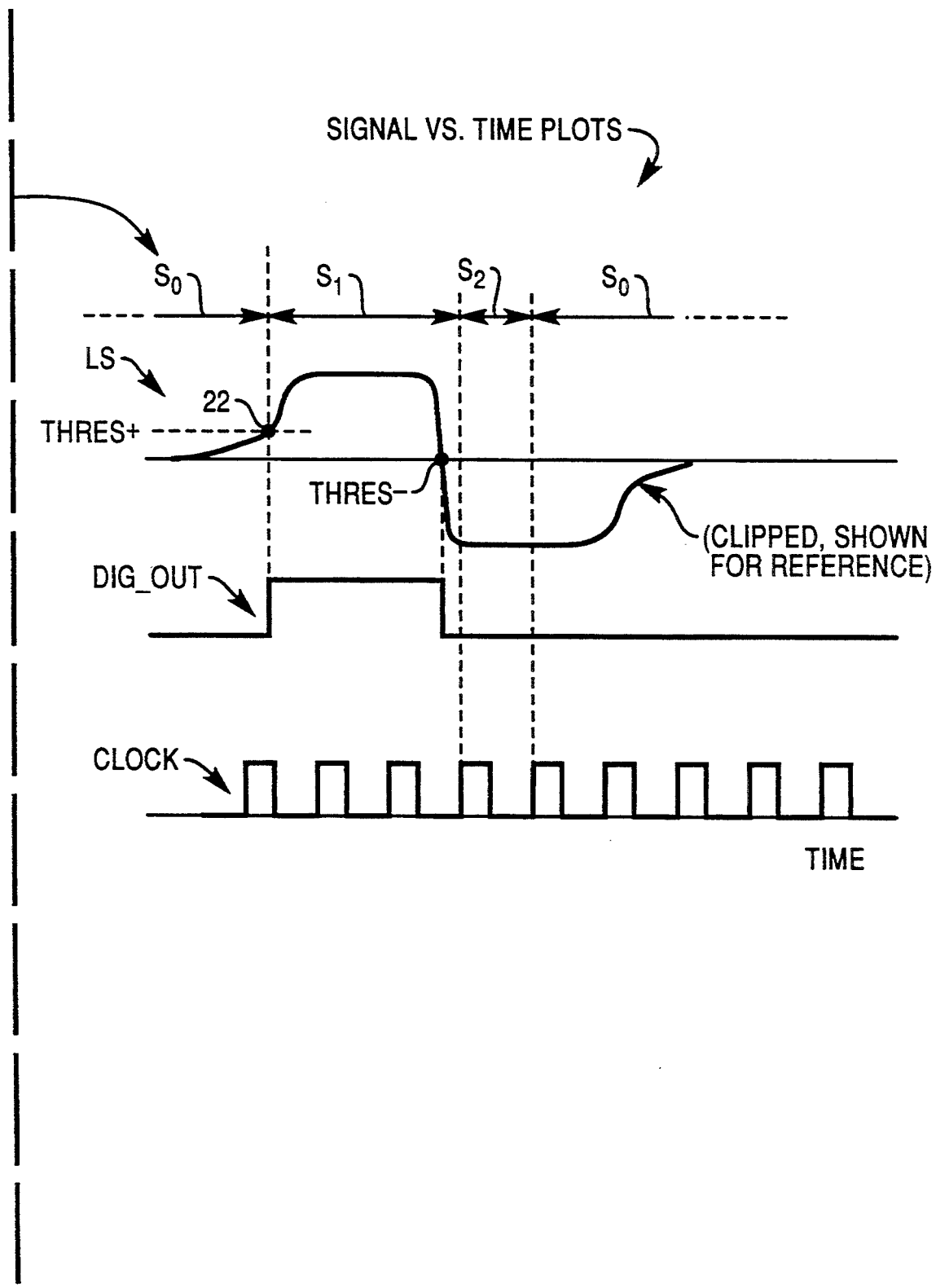

The PEAK DETECTOR, INTEGRATOR, STATE MACHINE and SCHMITT TRIGGER can be explained by FIGS. 8A and 8B. In the circuits in FIG. 8A, the PEAK DETECTOR is indicated by capacitors C2 and C3, and switches SW1 and SW2. The integrator is indicated by capacitor C4.

The limited reluctance signal, LS from FIG. 7, is fed to both the SCHMITT TRIGGER and FET M1, as shown in the upper left corner of FIG. 8A. The system repeatedly passes through a sequence of three states, during which THRES+ is adjusted, based on the amplitude of LS (and thus based on speed of the slotted wheel), as will now be explained.

State $S_0$

Initially, the state machine is in state $S_0$. Switches SW1 (in the upper left part of FIG. 8A) are closed, and LS is charging capacitor C2, as indicated by the dashed path 19. Capacitor C3 is grounded.

State $S_1$

When signal LS reaches THRES+, at point 22 on the LS-vs-time plot in FIG. 8B, the SCHMITT TRIGGER switches, driving DIG_OUT to a HIGH state, as shown, causing the STATE MACHINE to switch into state $S_1$, as indicated at the top of the SIGNAL-vs-TIME PLOTS. The relevant circuit is that in center, labeled $S_1$. DIG_OUT has gone HIGH. Nothing else changes, however, and LS continues to charge C2, if the voltage on C2 has not yet reached that of (LS-minus-the-voltage-drop-across-M1).

State $S_2$

When the signal LS drops to THRES−, which is preferably zero volts, as indicated on the LS plot, the STATE MACHINE switches into state $S_2$. This state causes switches SW1 to open, and SW2 to close, as indicated in the circuit labeled S2, located at the lower left. Now, C2 and C3 are connected in parallel, with each other and with C4.

Considering this connection in stepwise fashion, the connection of C2 with C3 causes the voltage originally on C2 to be cut in half: C2 and C3 are equal in value, but C3 carried no charge, because it was previous grounded. Connecting them together divided the voltage initially on C2 in half. Then, the charge shared by C2 and C3 is applied to C4. C4 may or may not have a pre-existing voltage at this time.

In essence, a 20-pF capacitor (C2-plus-C3) having a charge $Q_{20}$ and voltage $V_{20}$ is connected in parallel with a 50-pF capacitor (C4) having an initial charge $Q_{50}$ and voltage $V_{50}$, both of which are possibly zero.

The reader can compute the resulting voltage of C4 by combining and solving the following equations, as known in the art: $V_{50}=V_{20}$, $C_{20}=Q_{20}/V_{20}$, and $C_{50}=Q_{50}/V_{50}$. However, in general, since C4 (ie, $C_{50}$ in the preceding equations) has a value of 50 pF, which is 2.5 times large than the combined value of C2-plus-C3 (ie, $C_{20}$ or 20 pF), C4 does not attain the full voltage of C2. Restated, all of the voltage on C2 (which is indicative of the size of the LS signal) is initially applied to C4, however, when SW2 is closed, the total charge in C2 is redistributed between C2 and C4, resulting in a lower voltage across C4. Since C4 has a higher capacitance than C2 (50 pF and 20 pF, respectively) and Q remains constant, then voltage across C4 must necessarily drop in accordance with the above equation.

Thus, THRES+ is incrementally driven to the voltage of C2, and is not changed abruptly.

State $S_2$ lasts for a single clock cycle. At the next clock cycle, the STATE MACHINE switches into state $S_0$, and the process repeats. The individual components will now be considered in more detail.

PEAK DETECTOR

Figure 9:
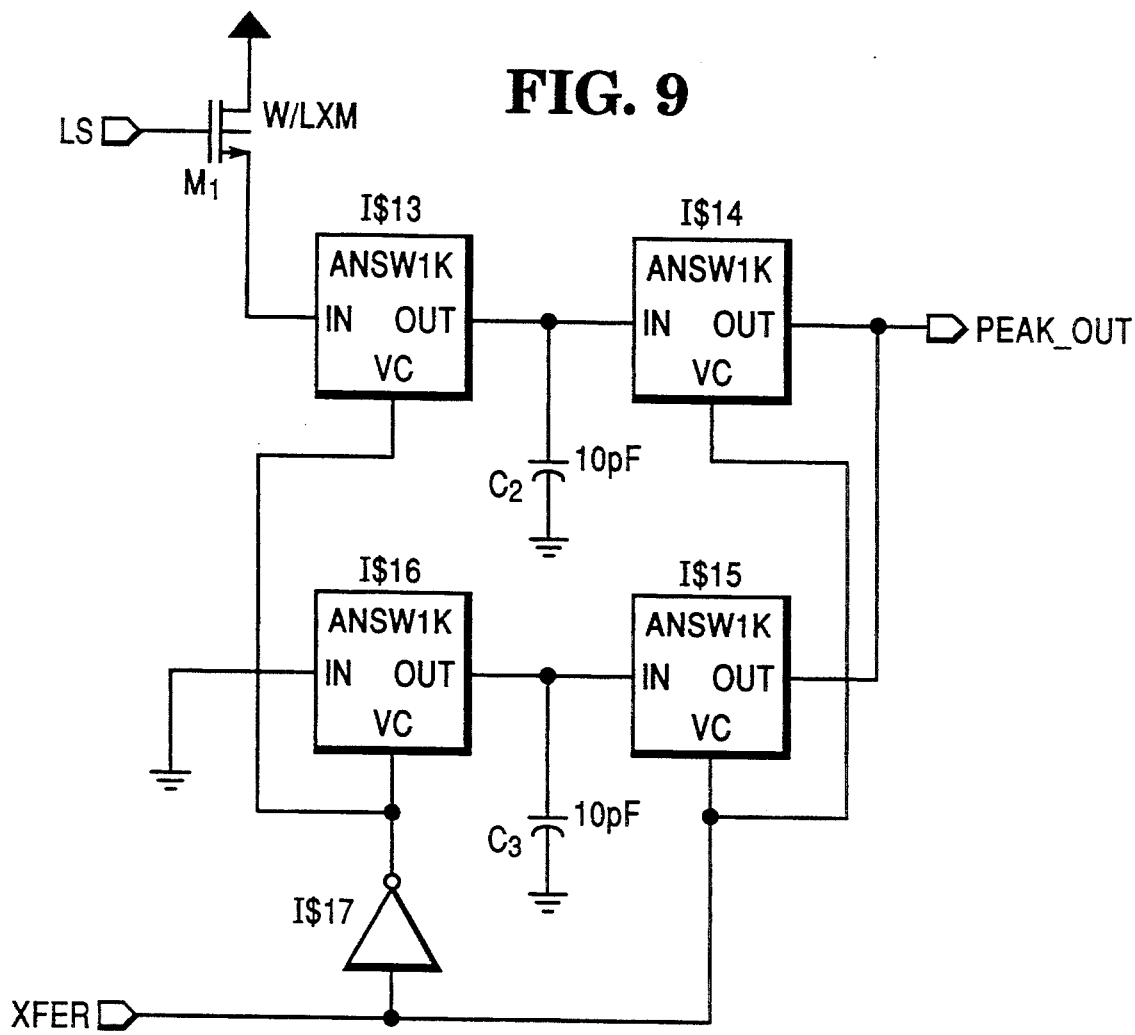
FIG. 9 illustrates the PEAK DETECTOR of FIG. 5.

In FIG. 9, the limited reluctance signal, LS, is fed to node LS of the PEAK DETECTOR. A diode effect is present at this node, for two reasons. One, the signal has already been half-wave rectified, by the LIMITER, as discussed above. Two, M1 is a field-effect device. That is, when the signal at node LS goes HIGH, M1 is triggered into conduction. However, when the signal goes LOW, M1 is turned off. Therefore, M1 passes current only when node FS is above the threshold voltage, $V_T$, of M1. M1, in this respect, resembles a diode.

Thus, with the half-wave rectification, a net charging current can flow into C2. (Without the rectification, the capacitor C2 would be alternately charged but then discharged and re-charged to a negative value.) C2 acquires a voltage indicative of the limited signal LS.

Two States of Peak Detector

State 1

Figure 9A:
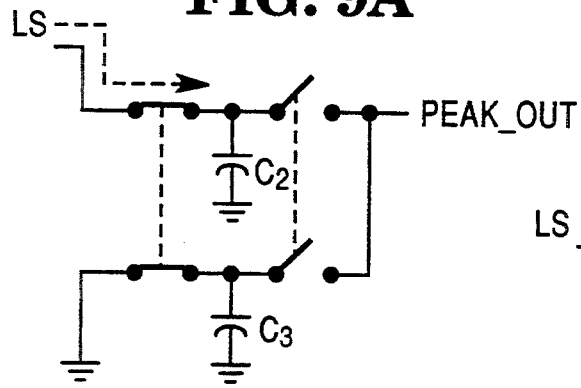
FIGS. 9A and 9B illustrate the two alternate states in which the analog switches ANSW1K of FIG. 9 can reside.

The PEAK DETECTOR can be viewed as residing in one of two possible states. The first state is shown in FIG. 9A. This state persists so long as the XFER line is LOW. (XFER is controlled by the STATE MACHINE.) In this state, two significant events occur. One, the signal on line LS (also shown in FIG. 9) delivers a current through M1 and charges capacitor C2. Thus, C2 acquires a voltage indicative of the magnitude of signal LS, which is the Limited Reluctance signal. The second significant event is that capacitor C3 is grounded, and thereby held at zero volts.

State 2

Figure 9B:
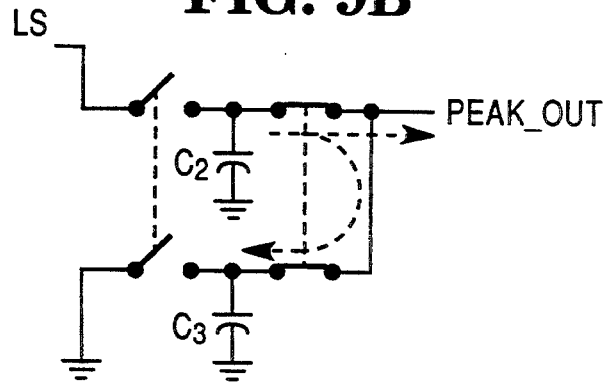

The second state is caused by a HiGH signal on line XFER. In this state, shown in FIG. 9B, capacitors C2 and C3 are disconnected from their respective inputs, namely, LS and ground, and both are then connected to a common output, PEAK_OUT.

In this state, two significant events occur. One, the charge on C2 is now divided between C2 and C3. Because the capacitors have equal values (10 pF each), the voltage carried by C2 becomes cut in half. The second event is that the now-halved voltage is applied to line PEAK_OUT. This line, as FIG. 5 indicates, is connected to THRES+, to which is also connected capacitor C4 in FIG. 11.

Thus, at this time, capacitors C2, C3, and C4 are all connected in parallel, and acquire the same voltage. If C4 is initially at zero volts, and signal LS is constant, C4 will charge to approximately the voltage of LS after a few switching cycles of SW1 and SW2. Switches SW1 and SW2 take the form of analog switches, known in the art, and are labeled ANSW1K in FIG. 9.

STATE MACHINE

Figure 10:
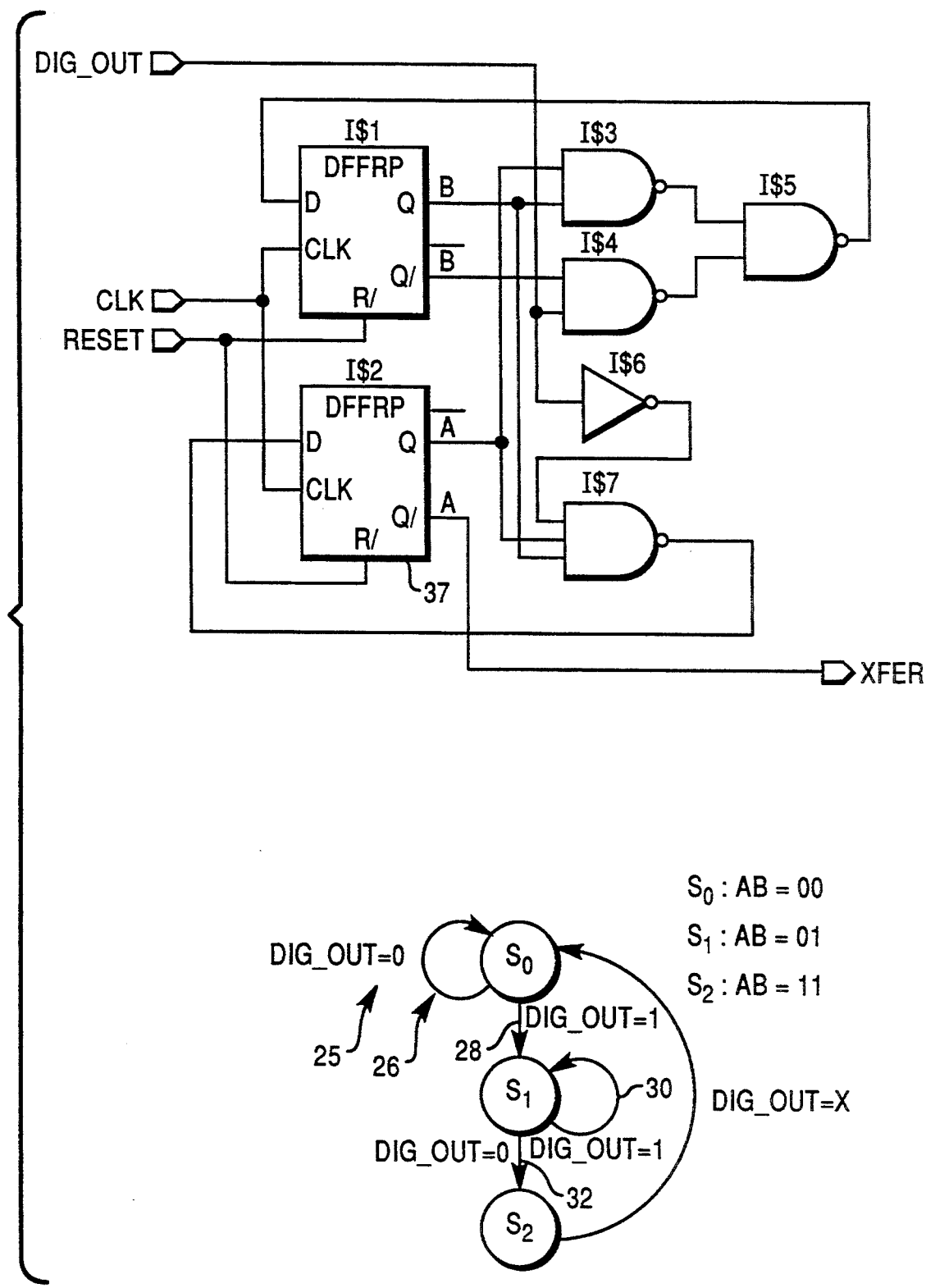
FIG. 10 illustrates the STATE MACHINE of FIG. 5, together with the STATE DIAGRAM which describes the operation of the STATE MACHINE.

FIG. 10 shows the STATE MACHINE of FIG. 5. The circuitry of the STATE MACHINE is self-explanatory. (Details concerning the design and operation of simple state machines can be found in chapter 4 of *COMPUTER ENGINEERING, Hardware Design*, by Morris Mano (Prentice Hall, 1988, ISBN 0-13-162926-3). This book is incorporated by reference.) As the STATE DIAGRAM indicates, the STATE MACHINE traverses through three states, which will now be explained.

There are two state variables in the STATE MACHINE, namely, A and B, as indicated, produced by D-type flip-flops labeled DFFRP. There are two inputs namely, DIG_OUT and a CLOCK, as indicated. In the STATE DIAGRAM, the STATE MACHINE begins in a state wherein AB=00, designated $S_0$. So long as DIG_OUT remains at 0, as indicated by the "0" symbol 25, the STATE MACHINE remains in state $S_0$, as indicated by arrow 26. This condition persists so long as the signal LS in FIG. 5 remains below THRES+, thereby keeping DIG_OUT at zero. The time during which this condition persists is indicated as $S_0$ on the SIGNAL-vs-TIME PLOTS in FIG. 8B.

When DIG_OUT goes HIGH, as indicated by the symbol "DIG_OUT=1" in the STATE DIAGRAM (located below $S_0$) the STATE MACHINE enters state $S_1$ at the next clock pulse, as indicated by the arrow 28. (The STATE DIAGRAM does not indicate the clock pulses, which are those on line CLK in the STATE MACHINE.) In this state, AB=01. DIG_OUT is now HIGH because the signal on line LS in FIG. 5 has now exceeded THRES+. Restated, the STATE MACHINE switches to state $S_1$ when the Limited Signal, LS, exceeds THRES+. From one point of view, state $S_1$ means that the peak voltage of the reluctance signal is approaching.

So long as DIG_OUT remains HIGH, the STATE MACHINE remains in state $S_1$, as indicated by arrow 30 in the STATE DIAGRAM. When DIG_OUT falls to a value of zero, the STATE MACHINE enters state $S_2$ at the next clock pulse, as indicated by arrow 32. In this state, AB=11.

Variable A (ie, an output of flip-flop 37) serves as the signal XFER in FIG. 8A. When XFER attains a value of ONE, the analog switches SW1 and SW2 in FIG. 9A and 9B switch into the second state, shown in FIG. 9B, thereby connecting the capacitors C2, C3, and C4 together. The connection updates the value of THRES+: part of the voltage initially present on C2 is applied to C4, which applies THRE+ to the SCHMITT TRIGGER, as discussed above.

RETURN TO $S_0$

At the next clock pulse, irrespective of the value of DIG_OUT, as indicated by the symbol "X" in the STATE DIAGRAM, the STATE MACHINE returns to state $S_0$, and the cycle repeats.

Therefore, the STATE MACHINE, in effect, detects each zero-crossing of the LS signal, and modifies THRES+ in accordance with the voltage on C2, at this time. Since the voltage on C2 depends on the size of the reluctance signal, which depends on speed of the slotted wheel, THRES+, in effect, is modified by wheel speed. At high wheel speeds, THRES+ is larger; at low speeds, THRES+ is smaller.

However, no separate measuring apparatus is used to measure wheel speed. Thus, a single signal, FS, performs a three-fold task. First, the timing of LS causes the zero-crossing of DIG_OUT. Second, the amplitude of LS modifies THRES+. Third, LS (by triggering DIG_OUT) causes the STATE MACHINE to cycle through its sequences.

It is important to observe that the STATE MACHINE operates to detect the zero-crossing of the LS signal. Other approaches to detecting the zero crossing can be undertaken, such as differentiation and other types of threshold comparison.

LEAKY INTEGRATOR

In FIG. 11, switches SW4 and SW5 alternate between the states shown in FIGS. 11A and 11B. The alternation is caused by the clock pulses CLK, which are indicated in FIG. 8. Thus, a small amount of charge is repeatedly drained from C4 by the small (2 pF) capacitor C5, and dumped to ground. This repeated draining has the effect of a large resistor, such as phantom resistor 37 in FIG. 11, connected in parallel with C4:C4 will eventually lose its charge, if not re-charged.

However, the apparatus in dashed block 39 in FIG. 11 keeps C4 charged to a minimum voltage: when the voltage on C4 falls below MIN_THRES+, comparator 41 turns on FET M2, and applies a current to C4, charging C4 up to MIN_THRES+. Thus, a minimum THRES+ is maintained. This minimum is below the peak voltage of the smallest reluctance signal expected.

One reason for utilizing a leaky integrator is that, if the engine should stop, the DIG_OUT signals will terminate, causing the STATE MACHINE to stop cycling. Consequently, C2 and C3 will not cycle between their states in FIGS. 9A and 9B. Thus, in theory at least, C4 can retain a high voltage, placing THRES+ above the noise level. With such a high THRES+, the small reluctance signals produced during engine cranking (ie, a low-speed condition) will not be detected, and the spark plugs will not be fired. The engine will not start.

C5 depletes the charge on C4 and prevents this situation.

It is likely that the natural leakiness of C4, such as through the leakage path through M2, would drain sufficient charge sufficiently rapidly to reduce THRES+ to MIN_THRES+. Consequently, the leaky integrator may not be strictly necessary, but is provided as a precaution.

SCHMITT TRIGGER

Figure 12:
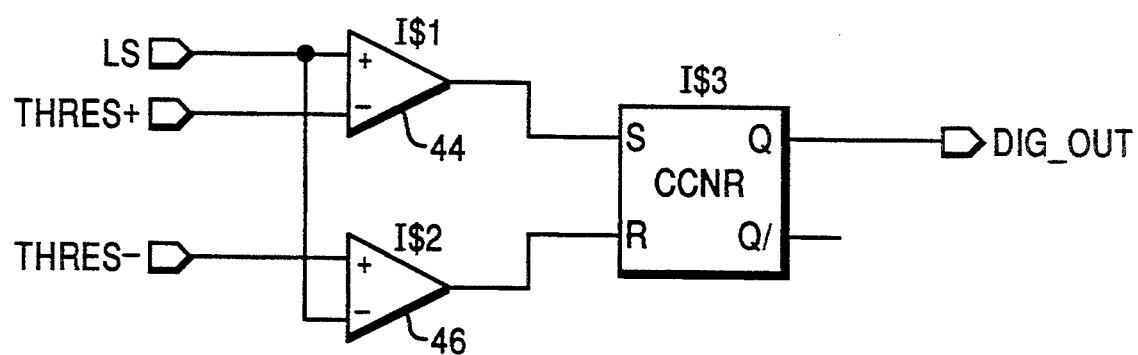
FIG. 12 illustrates the SCHMITT TRIGGER of FIG. 5.

FIG. 12 illustrates the SCHMITT TRIGGER. Two comparators 44 and 46 compare the limited reluctance signal, LS, with THRES+ and THRES−, respectively. The comparators feed the inputs of an R-S flip flop, taking the form of Cross-Coupled Nor Gates (CCNR), which produces DIG_OUT.

Numerous substitutions and modifications can be undertaken without departing from the true spirit and scope of the invention. What is desired to be secured by Letters Patent is the Invention as defined in the following claims.

I claim:

1. A signal conditioner for a reluctance sensing system which receives a reluctance signal comprising two signal parts of opposite polarity with a zero crossing separating the parts, and compares the reluctance signal with a threshold value, comprising means for periodically sampling the reluctance signal; and means for modifying the threshold value, after the sampling, based on the sampled reluctance signal.

2. Apparatus according to claim 1 and further comprising means for clamping the sampled reluctance signal.

3. A system for processing an alternating-current signal SENSE, which is produced by a probe which senses passage of slots in a slotted wheel, comprising:

a) an INPUT FILTER for
i) receiving SENSE, ii) removing some frequency components from SENSE, and then
iii) producing a smaller signal FS based on SENSE;

b) a LIMITER for clamping FS to a limited signal LS;

c) a PEAK DETECTOR for periodically producing a signal PEAK_OUT, indicative of the last highest value of LS;

d) a SCHMITT TRIGGER for receiving nS and producing a pulse DIG_OUT after LS exceeds a first threshold THRES+;

e) means for producing the first threshold THRES+; and f) a STATE MACHINE which cycles through a plurality of states, in response to DIG_OUT, causing a periodic modification of THRES+, based on PEAK_OUT.

4. A system for processing an alternating-current signal SENSE, which is produced by a probe which senses passage of slots in a slotted wheel, comprising:

a) an INPUT FILTER for receiving SENSE and producing a signal FS such that
i) frequency components above a predetermined threshold in SENSE are absent in FS and
ii) FS is a predetermined fraction of the voltage SENSE;

b) a LIMITER for
i) receiving the signal FS and
ii) clamping FS in order to produce a limited signal LS which is constrained within predetermined limits;

c) a PEAK DETECTOR for receiving signal LS and storing a signal PEAK_OUT, indicative of the last highest value of LS;

d) a SCHMITT TRIGGER for receiving LS and
i) producing a signal DIG_OUT when LS exceeds a first threshold THRES+; and
ii) driving DIG_OUT to zero when LS falls to a second threshold THRES−;

e) means for producing the first threshold THRES+; and f) a STATE MACHINE which cycles through a plurality of states, in response to DIG_OUT, causing the PEAK DETECTOR to apply a voltage derived from PEAK_OUT to an input to the SCHMITT TRIGGER, after each time DIG_OUT reaches zero.

5. A method of processing a periodic signal produced by a reluctance sensor, comprising the following steps:

a) deriving a signal from the periodic signal;

b) when the derived signal reaches a first threshold THRES+, producing a signal DIG_OUT;

c) when the derived signal falls to a second threshold THRES−, terminating DIG_OUT; and d) after each termination of DIG_OUT, modifying THRES+, based on the derived signal.

* * * * *

UNITED STATES PATENT AND TRADEMARK OFFICE
CERTIFICATE OF CORRECTION

PATENT NO. : 5,446,375
DATED : August 29, 1995
INVENTOR(S) : Luke Perkins

It is certified that error appears in the above-indentified patent and that said Letters Patent is hereby corrected as shown below:

Column 9, Line 9, delete "nS" and substitute --LS--.

Signed and Sealed this

Nineteenth Day of December, 1995

Attest:

BRUCE LEHMAN

Attesting Officer

Commissioner of Patents and Trademarks